(12) United States Patent
Setsompop et al.

(10) Patent No.: US 10,908,248 B2
(45) Date of Patent: Feb. 2, 2021

(54) SYSTEMS AND METHODS FOR SLICE DITHERED ENHANCED RESOLUTION SIMULTANEOUS MULTISLICE MAGNETIC RESONANCE IMAGING

(71) Applicant: THE GENERAL HOSPITAL CORPORATION, Boston, MA (US)

(72) Inventors: Kawin Setsompop, Cambridge, MA (US); Berkin Bilgic, Boston, MA (US); Lawrence L. Wald, Cambridge, MA (US); Thomas Witzel, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 0 days.

(21) Appl. No.: 15/566,761

(22) PCT Filed: Oct. 2, 2015

(86) PCT No.: PCT/US2015/053719
§ 371 (c)(1),
(2) Date: Oct. 16, 2017

(87) PCT Pub. No.: WO2016/171759
PCT Pub. Date: Oct. 27, 2016

(65) Prior Publication Data
US 2018/0100908 A1 Apr. 12, 2018

Related U.S. Application Data

(60) Provisional application No. 62/149,851, filed on Apr. 20, 2015.

(51) Int. Cl.
*G01R 33/56* (2006.01)
*G06T 11/00* (2006.01)
(Continued)

(52) U.S. Cl.
CPC ...... *G01R 33/5611* (2013.01); *G01R 33/4835* (2013.01); *G01R 33/5608* (2013.01); *G06T 11/00* (2013.01)

(58) Field of Classification Search
None
See application file for complete search history.

(56) References Cited

U.S. PATENT DOCUMENTS 7,371,365 B2 5/2008 Poduslo et al.
2012/0010497 A1 1/2012 Ehman et al.
(Continued)

FOREIGN PATENT DOCUMENTS

WO WO 2013036965 A2 3/2013

OTHER PUBLICATIONS

International Search Report and Written Opinion for International Application No. PCT/US2015/053719 dated Dec. 15, 2015, 11 pages.

*Primary Examiner* — Jermele M Hollington
*Assistant Examiner* — Suresh K Rajaputra
(74) *Attorney, Agent, or Firm* — Quarles & Brady LLP (57) ABSTRACT

Systems and methods for simultaneously acquiring high-resolution images of a subject from multiple different slice locations using magnetic resonance imaging ("MRI") are described. The present invention overcomes the aforementioned drawbacks by providing method for producing a plurality of images of a subject with a magnetic resonance imaging ("MRI") system. A radio frequency (RF) excitation field is applied by the MRI system to a portion of a subject that includes a plurality of slice locations. First data are simultaneously acquired from each of the plurality of slice locations by the MRI system.

11 Claims, 4 Drawing Sheets

(51) Int. Cl.
  *G01R 33/561* (2006.01)
  *G01R 33/483* (2006.01)

(56) References Cited

U.S. PATENT DOCUMENTS

2014/0225612 A1* 8/2014 Polimeni ............ G01R 33/4835
  324/309
2014/0364721 A1* 12/2014 Lee ...................... A61B 5/4836
  600/411

* cited by examiner

SYSTEMS AND METHODS FOR SLICE DITHERED ENHANCED RESOLUTION SIMULTANEOUS MULTISLICE MAGNETIC RESONANCE IMAGING

CROSS-REFERENCE TO RELATED APPLICATIONS

This application is a U.S. National Phase of PCT Application No. PCT/US2015/053719 filed on Oct. 2, 2015 which claims the benefit of U.S. Provisional Patent Application Ser. No. 62/149,851, filed on Apr. 20, 2015, and entitled "Enhanced Resolution Simultaneous Multislice Magnetic Resonance Imaging."

STATEMENT REGARDING FEDERALLY SPONSORED RESEARCH

This invention was made with government support under EB012107 and MH093765 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for simultaneous multislice ("SMS") MRI.

The move away from two-dimensional slice-by-slice imaging to SMS imaging results in a larger portion of the imaging volume being imaged at any given time during an MRI scan, which results in a significant gain in SNR efficiency and faster acquisition speed. Parallel imaging based SMS methods have been widely used in recent years to take advantage of this benefit, particularly in conjunction with the blipped-CAIPIRINHA method, described in U.S. Pat. No. 8,405,395, which allows the simultaneously acquired slices to be untangle in an efficient manner with low SNR loss.

Nonetheless, imaging at large slice acceleration factors can still come at a cost of SNR loss. For example, in diffusion imaging, where the intrinsic SNR is low, the slice acceleration factor is typically limited to 3-4 to allow SMS acquisitions to be performed without significant parallel imaging SNR loss that would off-set the gain in SNR efficiency.

Another area of development in moving away from standard two-dimensional imaging to a more efficient acquisition is the use of super-resolution techniques. Here, multiple sets of images are taken from the same imaging volume; each with a slice thickness that is thicker than what is desired in the final image. These sets of images contain sub-voxel shifts between them, which allow the use of super-resolution algorithms to reconstruct images at higher slice resolution. Sub-voxel spatial shifts in the slice direction have been shown to increase resolution in anatomical MRI.

Recently, super-resolution techniques have also been applied to diffusion imaging using orthogonal anisotropic acquisitions, with careful correction for geometric distortion in each spatial acquisition direction. Similar to SMS, super-resolution provides a desirable gain in SNR efficiency because signal from a larger volume (thicker slice) is being excited and acquired during each acquisition. However, unlike SMS, multiple acquisitions of the imaging volume are needed to create the final high-resolution image. The speed gain from acquiring each imaging volume at a larger slice thickness is thus offset by the multiple acquisitions required to create the final image. Therefore, super-resolution methods do not provide an improvement to the overall acquisition speed. However, an added benefit of super-resolution techniques is that they enable imaging at very high effective slice resolution that would be hard to achieve otherwise. Nonetheless, the use of super-resolution for very high resolution whole brain imaging is hampered by long acquisition and motion sensitivity, since good reconstruction require minimal motion between all of the low resolution imaging volumes.

Thus, there remains a need to provide methods for super-resolution imaging that can be implemented with shorter scan times while still maintaining adequate SNR, and that can be implemented without high sensitivity to subject motion.

SUMMARY OF THE INVENTION

The present invention overcomes the aforementioned drawbacks by providing a method for producing a plurality of images of a subject with a magnetic resonance imaging ("MRI") system. A radio frequency (RF) excitation field is applied by the MRI system to a portion of a subject that includes a plurality of slice locations. First data are simultaneously acquired from each of the plurality of slice locations by the MRI system. An RF excitation field is then applied to a portion of the subject that includes a plurality of shifted slice locations, wherein each of the plurality of shifted slice locations is shifted relative to the plurality of slice locations by a shift value. Second data are then simultaneously acquired from each of the plurality of shifted slice locations. First images are reconstructed from the first data using a simultaneous multislice (SMS) reconstruction technique, wherein each of the first images corresponds to one of the plurality of slice locations. Second images are also reconstructed from the second data using an SMS reconstruction technique, and wherein each of the second images corresponds to one of the plurality of shifted slice locations. High-resolution images are produced from the first images and the second images, wherein the high-resolution images have a higher through-plane resolution than the first images and the second images. The data acquisition can be repeated for a number of different shift values to obtain a number of different image sets at shifted slice locations. These additional image sets can then be used with the first and second images when producing the high-resolution images.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Described here are systems and methods for simultaneously acquiring high-resolution images of a subject from multiple different slice locations using magnetic resonance imaging ("MRI").

The systems and methods described here synergistically combine simultaneous multislice ("SMS") imaging and a super-resolution acquisition scheme. The techniques described here may be referred to as "Slice Dithered Enhanced Resolution Simultaneous MultiSlice" ("SLIDER-SMS"). The adaptation of SMS imaging techniques to implement a super-resolution acquisition enables a much higher slice acceleration factor to be achieved to provide a large gain in SNR efficiency over conventional two-dimensional imaging. In the techniques described here, the use of SMS imaging also enables a super-resolution acquisition to be performed much faster that previously possible, thereby reducing the its motion sensitivity and acquisition time.

To adapt SMS imaging techniques to implement a super-resolution acquisition scheme, the image reconstruction for SMS slice separation is performed prior to the super-resolution reconstruction. Advantageously, the SMS reconstruction can be performed to generate thick slice images without significantly affecting the overall reconstruction quality. In one embodiment, the average coil sensitivity information within each of the "thick" imaging slices is obtained for the SMS reconstruction (e.g., via slice-GRAPPA, SENSE), and is used to unalias the SMS slices prior to a super-resolution reconstruction.

The imaging techniques described here effectively encode the slice direction using only magnitude images under the assumption that there is minimal or no dephasing through the slice in each acquisition. This is particularly advantageous for diffusion imaging where the phase information is largely corrupted by small movements of the subject between encoding applications. Where these small movements occur in traditional diffusion imaging, a standard multi-shot Fourier encoding in the slice direction does not work well.

Figure 1:
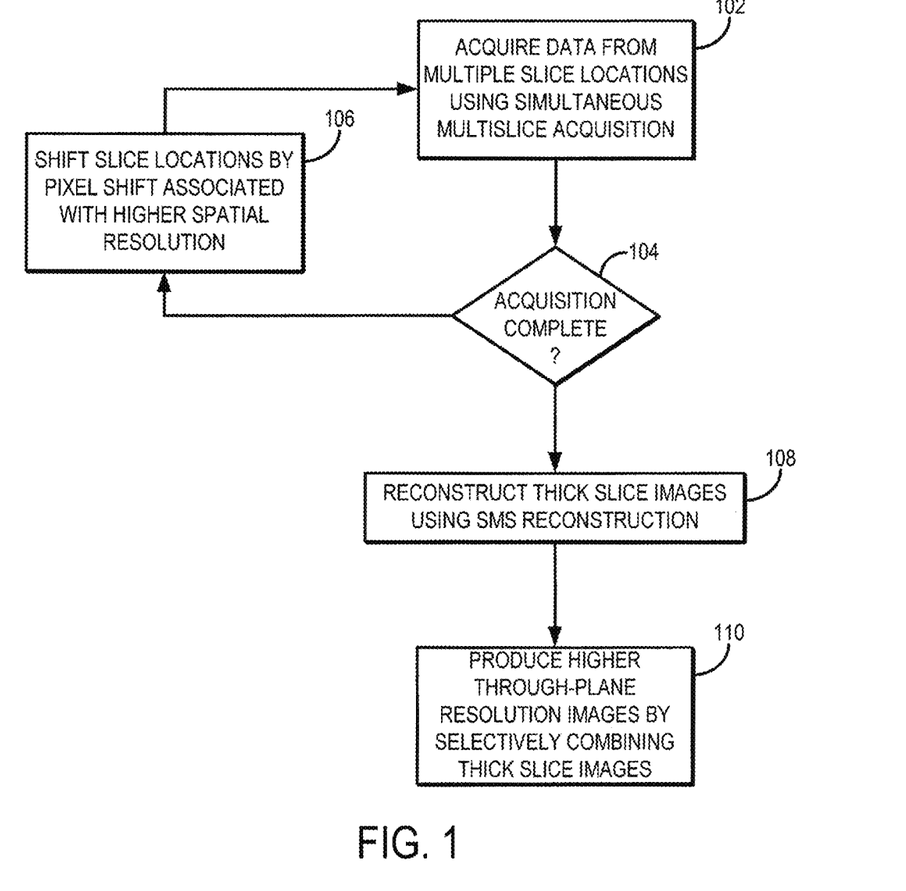
FIG. 1 is a flowchart setting forth the steps of an example method for simultaneously acquiring and later reconstructing high-resolution images using magnetic resonance imaging ("MRI").

Referring now to FIG. 1, a flowchart is illustrated as setting forth the steps of an example method for producing simultaneously acquired super-resolution magnetic resonance images. Data are acquired simultaneously from multiple different slice locations, as indicated at step 102. For instance, data are acquired using a suitable simultaneous multislice ("SMS") acquisition, such as blipped-CAIPI described in U.S. Pat. No. 8,405,395, which is herein incorporated by reference in its entirety, or Wave-CAIPI described in U.S. Pat. No. 8,981,776, which is herein incorporated by reference in its entirety.

In general, the data acquired in step 102 are representative of images that have relatively coarse through-plane resolution (i.e., the data are representative of thick slices). By using an SMS acquisition, however, the total scan time to acquire data from the multiple slice locations is reduced, so the in-plane resolution of each slice location can be increased without requiring an overall increase in total scan time. In some embodiments, the data are acquired using an array of RF receive coils.

A determination is made at decision block 104 whether the acquisition is complete, or whether additional data should be acquired. Preferably, additional data are acquired by shifting the set of slice locations by a shift value that is representative of a higher through-plane resolution than that used to acquire data from each slice location, as indicated at step 106. Thus, as one example, first data can be acquired at a plurality of slice locations and second data can be acquired at a plurality of shifted slice locations that are shifted by the shift value relative to the first slice locations. This process can then be repeated for additional shifts until the desired volume coverage is achieved.

Figure 2:
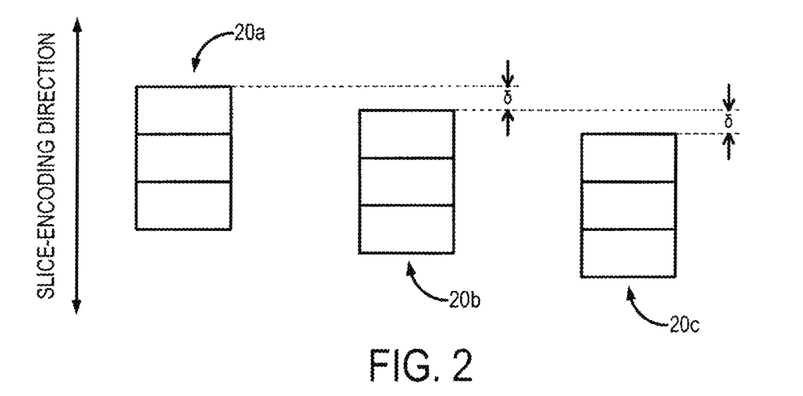
FIG. 2 illustrates an example of shifting a set of spatially adjacent slice locations by a shift value, b, that defines a higher through-plane spatial resolution.

An example of this acquisition is illustrated in FIG. 2, which shows a set of slices 20a being shifted by a shift value, $\delta$, to acquire data from shifted slice locations 20b and 20c. As one non-limiting example, the through-plane resolution of each thick slice can be 1.8 mm, and the pixel shift can be 600 µm. By shifting the slice locations three times, each time by 600 µm, three images with higher through-plane spatial resolution of 600 µm can be produced.

After all of the desired data are acquired, thick slice images are reconstructed for each slice location from the acquired data, as indicated at step 108. The thick slice images are reconstructed using a suitable SMS reconstruction technique, such as slice-GRAPPA or SENSE. Thus, in embodiments where the data are acquired using an array of RF receive coils, coil sensitivity profiles for each RF receive coil can be obtained and implemented in the SMS reconstruction. As one example, first images can be reconstructed from first data acquired at a plurality of slice locations and second images can be reconstructed from second data acquired at a plurality of shifted slice locations that are shifted by the shift value relative to the first set of slice locations.

As noted above, the thick slice images reconstructed by the SMS reconstruction have a coarse through-plane resolution. However, higher resolution images can be reconstructed from these thick slice images using a super-resolution reconstruction technique. Thus, as indicated at step 110, higher resolution images are produced from the reconstructed thick slice images. As one example, the higher resolution images can be generated using any suitable super-resolution reconstruction technique that implements multiple overlapping images shifted by a shift value. For instance, the higher resolution images can be generated based on a linear combination of selected thick slice images.

Example: Diffusion Imaging with SLIDER-SMS

In this example, the SLIDER-SMS acquisition and reconstruction technique described above was implemented for high resolution (e.g., 700 µm) diffusion imaging of the human brain.

Sub-millimeter isotropic resolution in vivo diffusion imaging ("DI") is challenging due a number of issues including the difficulty of maintaining thin slice profiles in spin-echo sequences, geometric distortions, long readout windows with increased $T_2$ blurring, and signal loss from long echo times, long scan times, and low signal-to-noise ratio ("SNR"), particularly at high b-values.

A large number of acquisition techniques have been developed to mitigate some of these issues, but have not enabled sub-millimeter isotropic whole brain DI, particularly in a reasonable time frame and with b-values greater than 1000 s/mm². Zoomed imaging methods such as ZOOPPA, and multi-shot acquisitions such as rs-EPI and MUSE reduce distortion and shorten the readout window, but limit brain coverage and cause long scan time, respectively. An example of the ZOOPPA method is described by R. M. Heidemann, et al., in "k-space and q-space: combining ultra-high spatial and angular resolution in diffusion imaging using ZOOPPA at 7 T," *NeuroImage*, 2012; 60:967-78.

It is contemplated that by implementing the SLIDER-SMS technique described above, further improvement in SNR efficiency and fast acquisition times can be achieved. ZOOPPA can also be implemented to reduce distortion and the long readout window. In this example, it is demonstrated that SLIDER-SMS with ZOOPPA can be used to acquire high quality DI that enables visualization of fine scale structures in both gray and white matter and at the gray-white matter boundaries.

Methods.

In this example, data were acquired from a subject's head using the acquisition techniques described above. In addition, ZOOPPA was performed with outer volume suppression applied to the neck area with phase encoding in the head-foot direction to provide low distortion while retaining whole-brain imaging capabilities. Data were acquired using sagittal EPI with a multiband acceleration factor of 2, with 3x-SLIDER encoding, in which three imaging volumes at 2.1 mm slice thicknesses were acquired with relative center positions of 0 mm, 0.7 mm and −0.7 mm. That is, thick slices (2.1 mm thickness) were acquired with a shift value of 0.7 mm.

Figure 3:
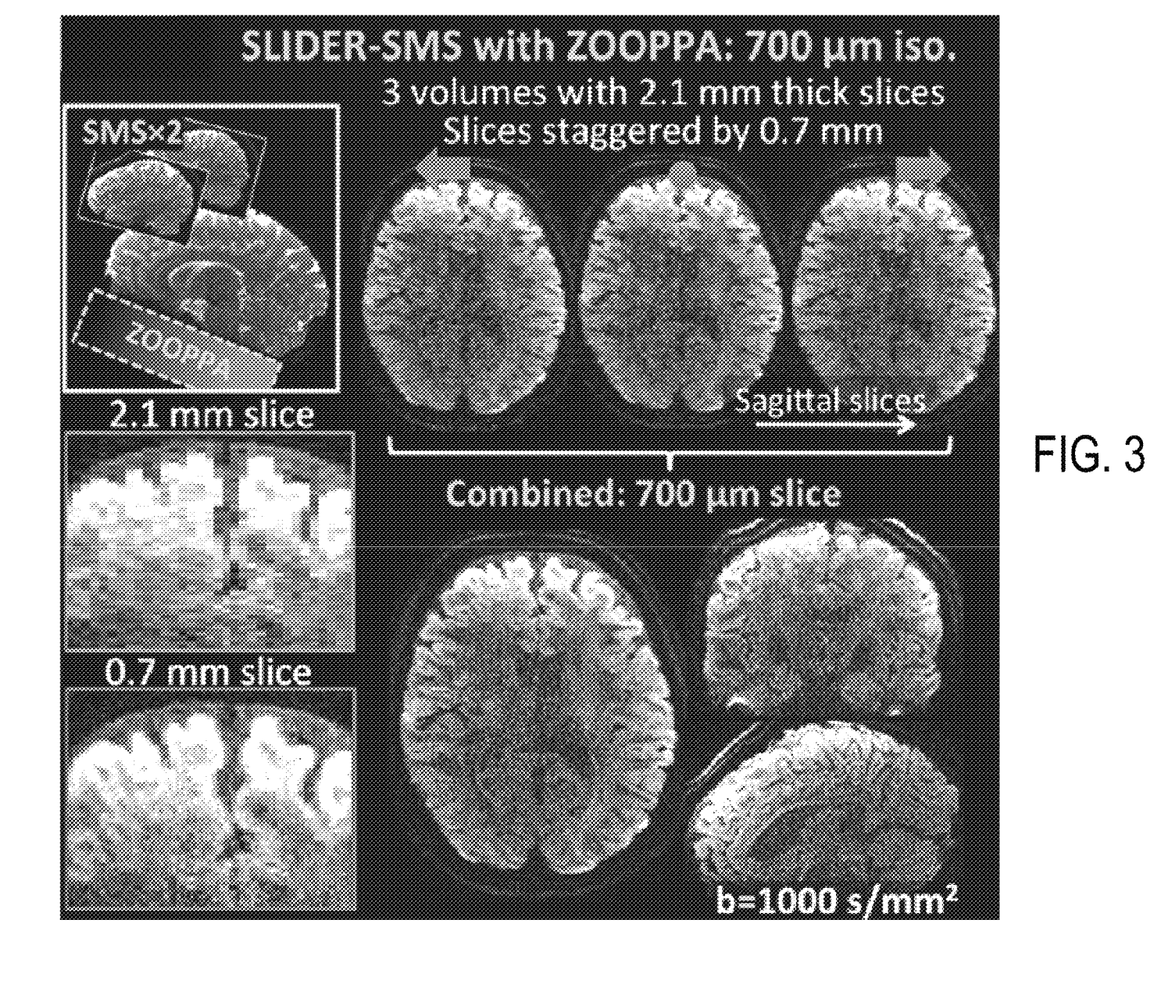
FIG. 3 illustrates example images acquired using a SLIDER-SMS technique as described herein.

An inverse matrix approach was used to combine the reconstructed thick slice volumes to generate higher resolution 0.7 mm thick slice images. An example of images reconstructed with this technique is provided in FIG. 3. Also illustrated in FIG. 3 is a comparison between an image from one of the 2.1 mm volumes and the higher-resolution images. Also, shown in FIG. 3 is the resulting single-direction 700 μm diffusion-weighted image at a b-value of 1000 s/mm². In this example, the multiband factor of 2 and the 3x-SLIDER factor provides a large $\sqrt{6}$ SNR benefit of volumetric encoding when compared to conventional DI.

Acquisition Data were acquired using SLIDER-SMS with ZOOPPA in a healthy volunteer on the 3 T CONNECTOM system (Siemens Healthcare, Germany) using a custom-built 64-channel RF head array.

Imaging parameters were: 700 μm iso; FOV=222×128×155.4 mm; $R_{zoom} \times R_{grappa}$=3.5 (1.74×2); MB-2; Partial Fourier=6/8; TE=82 ms, $TR_{eff}$=17.1 s (TR per dithered volume=5.1 s); effective echo spacing=0.29 ms, 64 diffusion directions at both b=1000 and 2500 s/mm² with an interspersed b=0 image every 15 volumes, total scan time about 40 minutes. A FLEET-ACS acquisition was employed to provide robust GRAPPA and slice-GRAPPA training data. The resulting diffusion data were analyzed via DSI Studio using a Generalized Q-space Imaging ("GQI") model.

Results.

Figure 4:
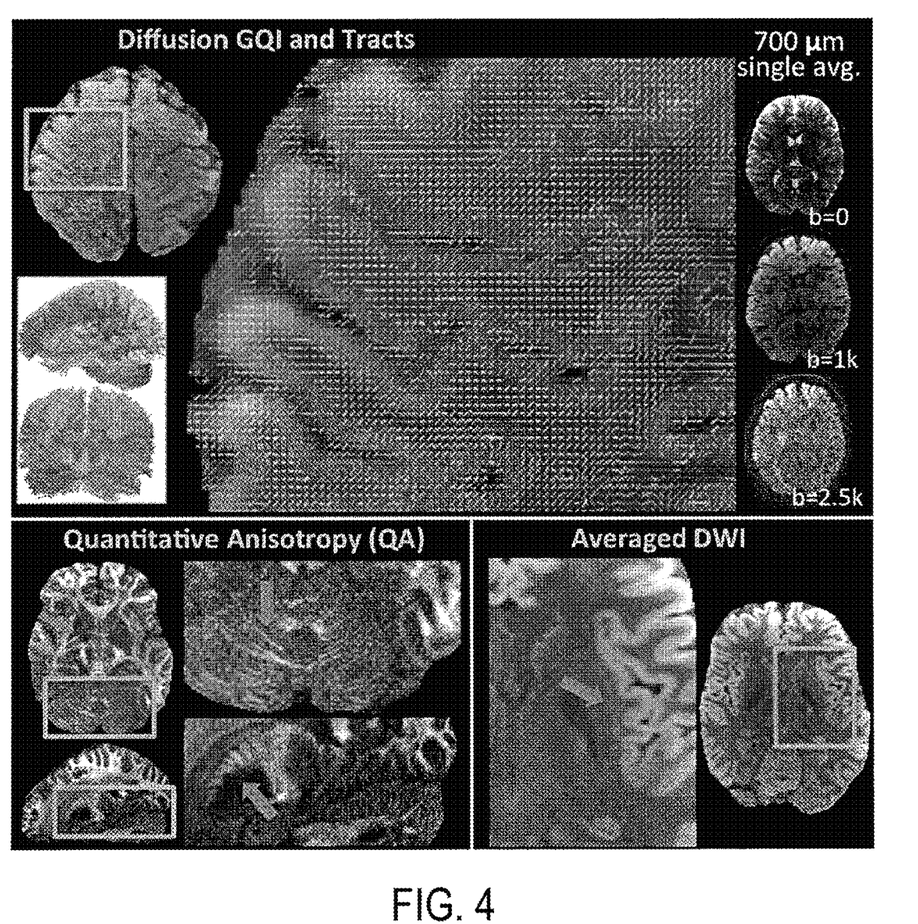
FIG. 4 illustrates example diffusion-weighted images and tractography images generated based on data acquired using a SLIDER-SMS technique as described herein.

In the top left, FIG. 4 shows the fiber and tractography results, where the fiber results in the zoomed region (identified by the boxed region) contain multiple voxels across the cortical depth at this resolution, with fibers appearing perpendicular as they enter into the cortex. In the top right, FIG. 4 shows 700 μm single average diffusion-weighted images at b=0, b=1000, and b=2500 s/mm² with good SNR. In the bottom left, FIG. 4 shows Quantitative Anisotropy results, where in the axial image the anterior commissure is observed (arrow). In the zoomed axial image, fine scale cerebellar white matter tracts are observed with the arrow indicating a particularly thin tract (with a single voxel diameter) running oblique to the slice direction (L-R) of SLIDER-SMS. This points to the ability of SLIDER-SMS in achieving high slice resolution.

Further, the zoomed sagittal image of the striatum also clearly depicts the cell-bridge connecting between the caudate and putamen. In the bottom right of FIG. 4, the averaged diffusion-weighted image is shown, where fine scale gray matter structures such as the claustrum (arrow) can be seen.

CONCLUSION.

In this example, SLIDER-SMS with ZOOPPA was implemented and its ability in providing high quality sub-millimeter DI at high b-values in a reasonable time frame was demonstrated. Such acquisition allows depiction of fine scale structures and opens up exciting possibilities in analyzing diffusion tracts at the gray-white matter boundary as well as within the cortex.

Figure 5:
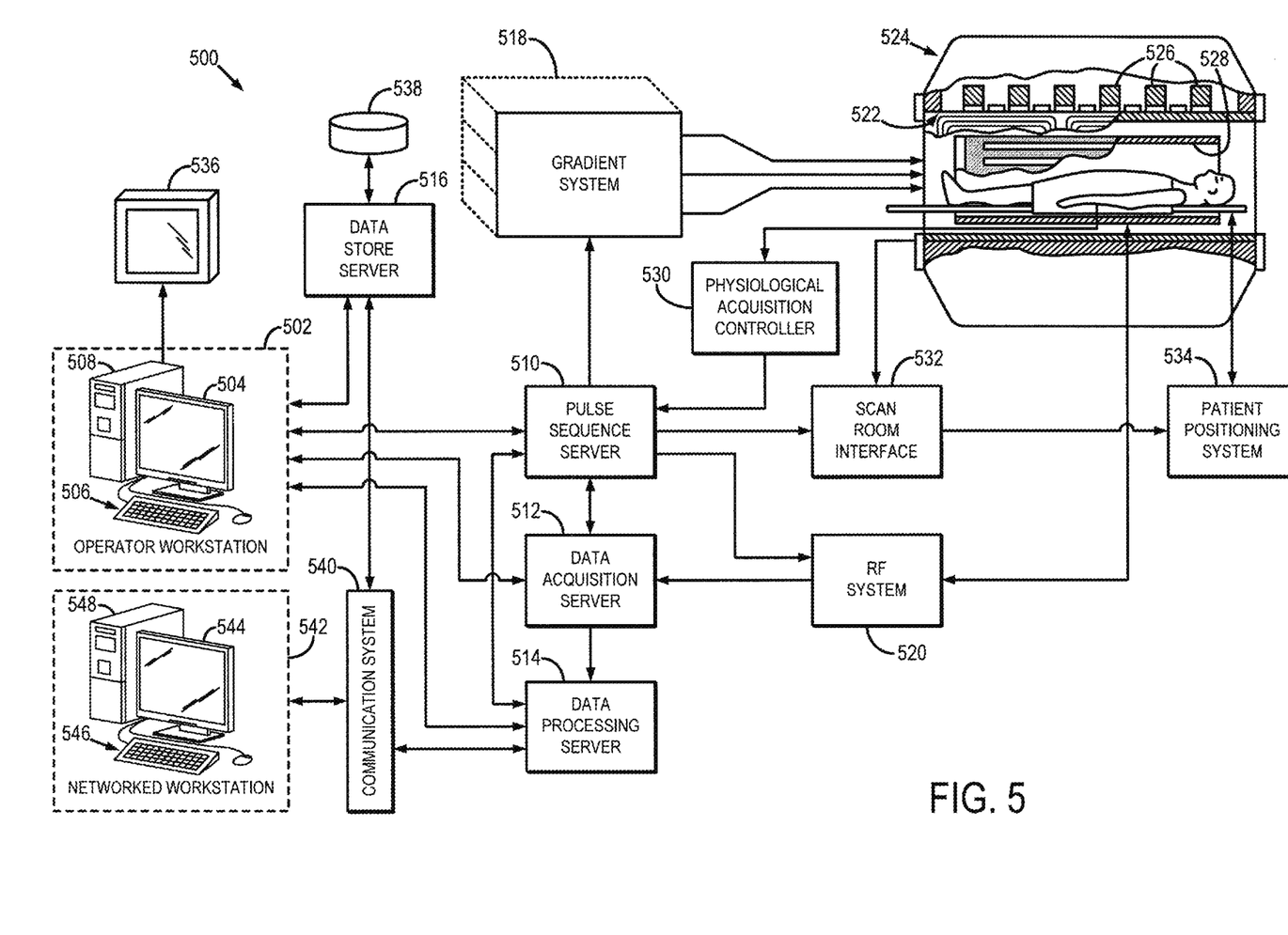
FIG. 5 is a block diagram of an example of a magnetic resonance imaging ("MRI") system.

Referring particularly now to FIG. 5, an example of a magnetic resonance imaging ("MRI") system 500 is illustrated. The MRI system 500 includes an operator workstation 502, which will typically include a display 504; one or more input devices 506, such as a keyboard and mouse; and a processor 508. The processor 508 may include a commercially available programmable machine running a commercially available operating system. The operator workstation 502 provides the operator interface that enables scan prescriptions to be entered into the MRI system 500. In general, the operator workstation 502 may be coupled to four servers: a pulse sequence server 510; a data acquisition server 512; a data processing server 514; and a data store server 516. The operator workstation 502 and each server 510, 512, 514, and 516 are connected to communicate with each other. For example, the servers 510, 512, 514, and 516 may be connected via a communication system 540, which may include any suitable network connection, whether wired, wireless, or a combination of both. As an example, the communication system 540 may include both proprietary or dedicated networks, as well as open networks, such as the internet.

The pulse sequence server 510 functions in response to instructions downloaded from the operator workstation 502 to operate a gradient system 518 and a radiofrequency ("RF") system 520. Gradient waveforms necessary to perform the prescribed scan are produced and applied to the gradient system 518, which excites gradient coils in an assembly 522 to produce the magnetic field gradients $G_x$, $G_y$, and $G_z$ used for position encoding magnetic resonance signals. The gradient coil assembly 522 forms part of a magnet assembly 524 that includes a polarizing magnet 526 and a whole-body RF coil 528.

RF waveforms are applied by the RF system 520 to the RF coil 528, or a separate local coil (not shown in FIG. 5), in order to perform the prescribed magnetic resonance pulse sequence. Responsive magnetic resonance signals detected by the RF coil 528, or a separate local coil (not shown in FIG. 5), are received by the RF system 520, where they are amplified, demodulated, filtered, and digitized under direction of commands produced by the pulse sequence server 510. The RF system 520 includes an RF transmitter for producing a wide variety of RF pulses used in MRI pulse sequences. The RF transmitter is responsive to the scan prescription and direction from the pulse sequence server 510 to produce RF pulses of the desired frequency, phase, and pulse amplitude waveform. The generated RF pulses may be applied to the whole-body RF coil 528 or to one or more local coils or coil arrays (not shown in FIG. 5).

The RF system 520 also includes one or more RF receiver channels. Each RF receiver channel includes an RF preamplifier that amplifies the magnetic resonance signal received by the coil 528 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \quad (1);$$

and the phase of the received magnetic resonance signal may also be determined according to the following relationship:

$$\varphi = \tan^{-1}\left(\frac{Q}{I}\right). \quad (2)$$

The pulse sequence server 510 also optionally receives patient data from a physiological acquisition controller 530. By way of example, the physiological acquisition controller 530 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 510 to synchronize, or "gate," the performance of the scan with the subject's heart beat or respiration.

The pulse sequence server 510 also connects to a scan room interface circuit 532 that receives signals from various sensors associated with the condition of the patient and the magnet system. It is also through the scan room interface circuit 532 that a patient positioning system 534 receives commands to move the patient to desired positions during the scan.

The digitized magnetic resonance signal samples produced by the RF system 520 are received by the data acquisition server 512. The data acquisition server 512 operates in response to instructions downloaded from the operator workstation 502 to receive the real-time magnetic resonance data and provide buffer storage, such that no data is lost by data overrun. In some scans, the data acquisition server 512 does little more than pass the acquired magnetic resonance data to the data processor server 514. However, in scans that require information derived from acquired magnetic resonance data to control the further performance of the scan, the data acquisition server 512 is programmed to produce such information and convey it to the pulse sequence server 510. For example, during prescans, magnetic resonance data is acquired and used to calibrate the pulse sequence performed by the pulse sequence server 510. As another example, navigator signals may be acquired and used to adjust the operating parameters of the RF system 520 or the gradient system 518, or to control the view order in which k-space is sampled. In still another example, the data acquisition server 512 may also be employed to process magnetic resonance signals used to detect the arrival of a contrast agent in a magnetic resonance angiography ("MRA") scan. By way of example, the data acquisition server 512 acquires magnetic resonance data and processes it in real-time to produce information that is used to control the scan.

The data processing server 514 receives magnetic resonance data from the data acquisition server 512 and processes it in accordance with instructions downloaded from the operator workstation 502. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 514 are conveyed back to the operator workstation 502 where they are stored. Real-time images are stored in a data base memory cache (not shown in FIG. 5), from which they may be output to operator display 502 or a display 536 that is located near the magnet assembly 524 for use by attending physicians. Batch mode images or selected real time images are stored in a host database on disc storage 538. When such images have been reconstructed and transferred to storage, the data processing server 514 notifies the data store server 516 on the operator workstation 502. The operator workstation 502 may be used by an operator to archive the images, produce films, or send the images via a network to other facilities.

The MRI system 500 may also include one or more networked workstations 542. By way of example, a networked workstation 542 may include a display 544; one or more input devices 546, such as a keyboard and mouse; and a processor 548. The networked workstation 542 may be located within the same facility as the operator workstation 502, or in a different facility, such as a different healthcare institution or clinic.

The networked workstation 542, whether within the same facility or in a different facility as the operator workstation 502, may gain remote access to the data processing server 514 or data store server 516 via the communication system 540. Accordingly, multiple networked workstations 542 may have access to the data processing server 514 and the data store server 516. In this manner, magnetic resonance data, reconstructed images, or other data may be exchanged between the data processing server 514 or the data store server 516 and the networked workstations 542, such that the data or images may be remotely processed by a networked workstation 542. This data may be exchanged in any suitable format, such as in accordance with the transmission control protocol ("TCP"), the internet protocol ("IP"), or other known or suitable protocols.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing a plurality of images of a subject with a magnetic resonance imaging (MRI) system, the steps of the method comprising:
   (a) applying, with the MRI system, a radio frequency (RF) excitation field to a portion of a subject that includes a plurality of slice locations;
   (b) simultaneously acquiring, with the MRI system, first data from each of the plurality of slice locations;
   (c) applying, with the MRI system, an RF excitation field to a different portion of the subject that includes a plurality of shifted slice locations, wherein each of the plurality of shifted slice locations is shifted relative to the plurality of slice locations by a shift value along a slice encoding direction;

(d) simultaneously acquiring, with the MRI system, second data from each of the plurality of shifted slice locations;

(e) reconstructing first images from the first data using a simultaneous multislice (SMS) reconstruction technique, wherein each of the first images corresponds to one of the plurality of slice locations;

(f) reconstructing second images from the second data using an SMS reconstruction technique, wherein each of the second images corresponds to one of the plurality of shifted slice locations; and (g) producing high-resolution images from the first images and the second images based on a linear combination of the first images and the second images, wherein the high-resolution images have a higher through-plane resolution than the first images and the second images.

2. The method as recited in claim 1, wherein the higher-through plane resolution of the higher-resolution of the high-resolution images is determined by the shift value, and step (c) includes selecting the shift value based on a desired through-plane resolution of the high resolution images.

3. The method as recited in claim 1, wherein steps (b) and (d) includes acquiring the first data and the second data using an array of RF receive coils.

4. The method as recited in claim 3, further comprising obtaining a coil sensitivity profile for each RF receive coil in the array of RF receive coils, and wherein steps (e) and (f) include reconstructing the first images and the second images based in part on the coil sensitivity profile for each RF receive coil.

5. The method as recited in claim 4, wherein SMS reconstruction technique used in steps (e) and (f) is at least one of slice-GRAPPA or SENSE.

6. The method as recited in claim 1, wherein the plurality of slice locations includes a series of spatially adjacent slice locations, and wherein the plurality of shifted slice locations includes a series of spatially adjacent shifted slice locations that are shifted relative to the spatially adjacent slice locations by the shift value.

7. The method as recited in claim 1, wherein the shift value is smaller than a thickness of each slice location in the plurality of slice locations.

8. The method as recited in claim 1, wherein the through-plane resolution of the high-resolution images is less than one millimeter.

9. The method as recited in claim 8, wherein the through-plane resolution of the high-resolution images is less than about 700 micrometers.

10. The method as recited in claim 1, wherein steps (a) and (c) include acquiring the first and second data using a pulse sequence that includes producing a plurality of slice-encoding magnetic field gradient blips along a slice-encoding direction while at least one readout magnetic field gradient is established in order to impart a phase shift to formed echo signals such that data corresponding to different slice locations are shifted by a selected percentage of a field-of-view (FOV).

11. The method as recited in claim 1, wherein steps (c) and (d) are repeated to acquire additional data from a different plurality of shifted slice locations that are shifted relative to the plurality of slice locations by a different shift value, and further comprising reconstructing additional images from the additional data and producing the high-resolution images from the first images, the second images, and the additional images.

* * * * *

UNITED STATES PATENT AND TRADEMARK OFFICE
CERTIFICATE OF CORRECTION

PATENT NO. : 10,908,248 B2
APPLICATION NO. : 15/566761
DATED : February 2, 2021
INVENTOR(S) : Kawin Setsompop et al.

Page 1 of 1

It is certified that error appears in the above-identified patent and that said Letters Patent is hereby corrected as shown below:

In the Specification

Column 2, Line 66, "value, b that" should be --value, δ that--.

Signed and Sealed this
Twenty-third Day of March, 2021

Drew Hirshfeld
*Performing the Functions and Duties of the
Under Secretary of Commerce for Intellectual Property and
Director of the United States Patent and Trademark Office*